(12) United States Patent
Hulsey et al.

(10) Patent No.: US 6,229,262 B1
(45) Date of Patent: May 8, 2001

(54) ELECTRONIC POWER CONDITIONER ANODE VOLTAGE CONTROL

(75) Inventors: Stephen Hulsey, Los Angeles; James Lee, Monterey Park, both of CA (US)

(73) Assignee: Hughes Electronics Corporation, El Segundo, CA (US)

( * ) Notice: Subject to any disclaimer, the term of this patent is extended or adjusted under 35 U.S.C. 154(b) by 0 days.

(21) Appl. No.: 09/426,665

(22) Filed: Oct. 25, 1999

(51) Int. Cl.[7] ........................................ H01J 25/00
(52) U.S. Cl. ................................. 315/9; 315/3.5
(58) Field of Search ................. 315/9, 3.5, 225, 315/337

(56) References Cited

U.S. PATENT DOCUMENTS 5,764,003 * 6/1998 Boone ....................................... 315/9

* cited by examiner

Primary Examiner—Michael B Shingleton
(74) Attorney, Agent, or Firm—T. Gudmestad

(57) ABSTRACT

An anode control circuit for at least two traveling wave tubes powered by a common electronic power conditioner. The anode control circuit has separate anode drive circuits for the traveling wave tubes that are referenced to a voltage that is higher than the cathode voltage being supplied by the electronic power conditioner. A relay between the anode drive circuit and the anode of the traveling wave tube being driven opens or closes a path between the traveling wave tube and the cathode voltage supplied by the electronic power conditioner. The anode drive circuits are referenced to one of the collector voltages that is closest to the anode operating voltage and such that the anode voltage is more positive than the reference voltage.

6 Claims, 1 Drawing Sheet

ELECTRONIC POWER CONDITIONER ANODE VOLTAGE CONTROL

TECHNICAL FIELD

The present invention relates to an electronic power conditioner (EPC) and more particularly to anode voltage control for an EPC.

BACKGROUND ART

Traveling wave tubes (TWTs) are a common feature of most communication satellites. Multiple TWTs are used on spacecraft and generally an individual power supply, known as an electronic power condiditioner (EPC), is associated with each TWT. The EPC delivers the necessary bias voltages and currents to the TWT.

A dual EPC which allows one of two TWTs to be independently turned on and off, turns on and off the anode voltage to the respective TWT. In the prior art, this is done by referencing an anode drive circuit to the cathode potential.

In the prior art, the anode drive circuits are referenced to a cathode voltage that is common to both TWTs. In this configuration it is possible to vary the anode voltage between its normal operating voltage and the cathode voltage thereby turning off the respective TWT. A large anode drive voltage is required due to the large voltage difference between the anode voltage and the cathode voltage.

The prior art circuit is overly complex, which ultimately results in lowered operating efficiency. There is a need for an anode voltage control circuit that allows independent control of each TWT and improves the operating efficiency of an EPC.

SUMMARY OF THE INVENTION

The present invention is an anode voltage control circuit for an EPC that powers at least two TWTs. The present invention reduces the voltage produced by the anode drive circuits.

In the present invention, the anode drive circuit is referenced to a higher positive voltage than the cathode. This higher positive voltage is present at one of the collector voltages used by the TWT. The result is that a lower anode drive voltage is required to operate the TWTs. Fewer losses are produced when generating a lower control anode drive voltage, and the result is a more efficient EPC.

It is an object of the present invention to enhance the efficiency of an EPC that powers two TWTs. It is another object of the present invention to provide an anode voltage control circuit for the EPC. It is yet another object of the present invention to reference the anode drive circuit to a potential that is higher than the cathode voltage.

Other objects and features of the present invention will become apparent when viewed in light of the detailed description of the preferred embodiment when taken in conjunction with the attached drawings and appended claims.

BRIEF DESCRIPTION OF THE DRAWINGS

In order that the invention may be well understood, there will now be described one or more embodiments thereof, given by way of example, reference being made to the accompanying drawings, in which.

BEST MODE(S) FOR CARRYING OUT THE INVENTION

Figure 1:
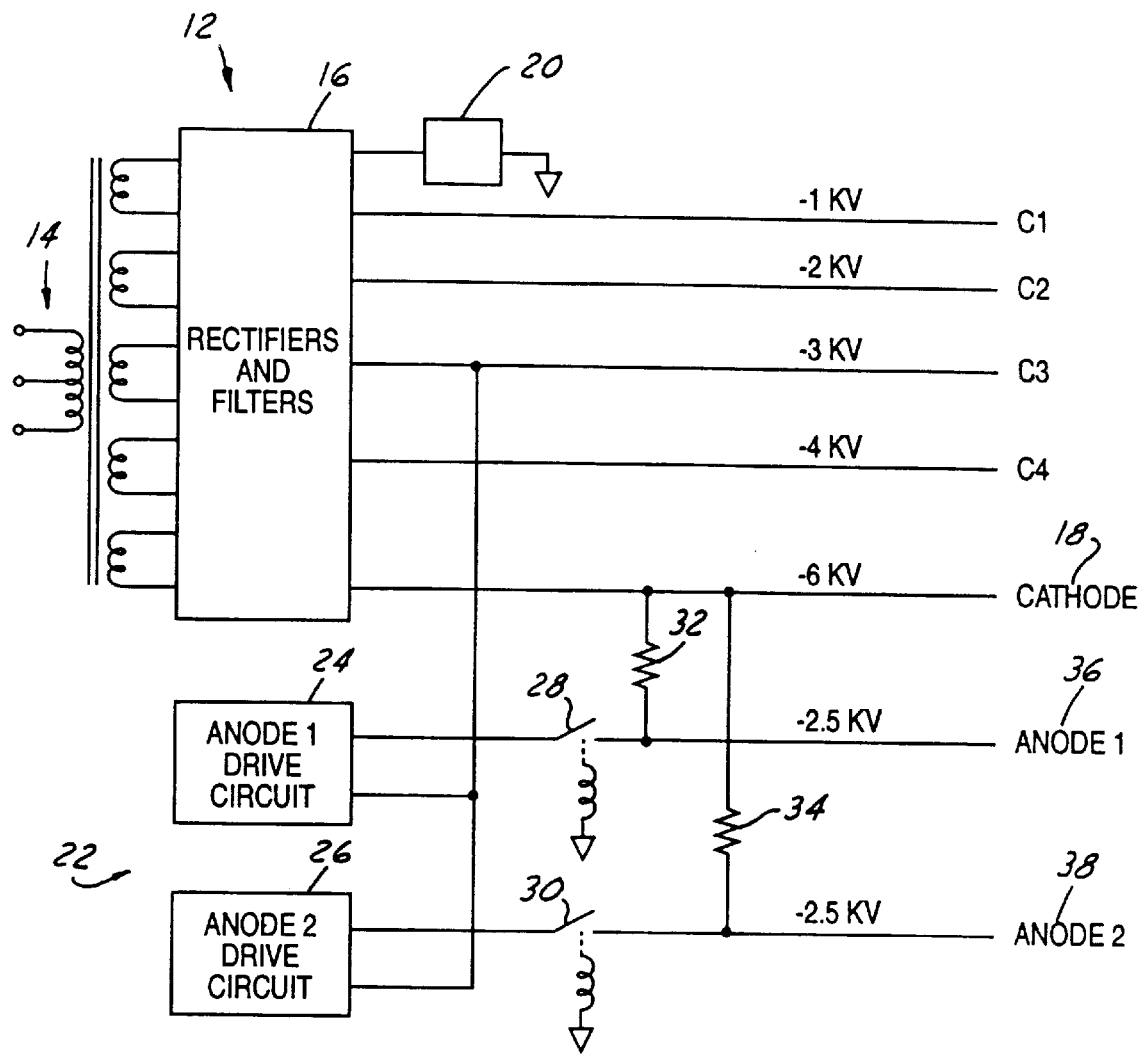
FIG. 1 is a schematic diagram of an anode voltage control circuit of the present invention.

FIG. 1 is a schematic diagram of part of an electronic power conditioner (EPC) 12 that is common to two TWTs (not shown). The part of the EPC 12 shown in FIG. 1 has a high voltage transformer 14, a system of rectifiers and filters 16 for supplying a series of fixed voltages to a plurality of collectors C1–C4 and a cathode 18. The collector voltages and the cathode are also common two TWTs. The part of EPC 12 also includes a linear regulator 20 for maintaining regulation of the cathode voltage.

The anode voltages are relatively constant during operation of the TWTs (not shown) but are varied to control and maintain a constant cathode current. In the present example, the anode voltages are shown to be –2.5 kV.

An anode control circuit 22 has a first anode drive circuit 24 for the first TWT and a second anode drive circuit 26 for the second TWT. The first and second anode drive circuits 24 and 26 are referenced to a voltage 25 that is closest to the anode voltage and such that the anode voltage is more positive than the reference voltage 25. In the present example, this is the voltage at collector C3.

The reference voltage 25 used is the collector voltage that is closest to the voltage of the anode and the anode voltage more positive than the reference voltage. For example, the collector voltage C3 in the present example has a voltage of –3 kV and the cathode is at a potential of –6 kV. The voltages shown are for illustration only and are not intended to limit the exact operating voltages of the present invention.

A first high voltage relay 28 and a second high voltage relay 30 are used to open and/or close a path, including first and second resistors 32 and 34, between the cathode and first and second anodes 36 and 38 respectively. The first and second resistors 32 and 34 are load resistors and can typically be hundreds of megaohms so that they dissipate very little power.

The high voltage relays 28 and 30 allow each of the two TWTs to be independently turned on and off. To turn a TWT off, the anode voltage must be brought to the cathode potential, –6 kV in the present example. Because the anode drive circuit is referenced to a collector voltage that is higher than the cathode voltage, a smaller voltage is needed from the anode drive circuit to make up the difference. For example, the anode voltage in the present example is –2.5 kV, and the reference voltage is –3 kV. Therefore, a voltage difference of only 500 V is needed from the anode drive circuit.

To bring the anode voltage to the cathode potential, the respective high voltage relay 26 or 28 is opened, providing a bleeder path through the resistor, 30 or 32, to the cathode 18. When the anode voltage reaches the cathode potential, the TWT is turned off. Having independent high voltage relays 28 and 30 for each anode 36 and 38, the TWTs can be independently operated.

Fewer losses are produced in generating a lower control anode drive voltage, thereby resulting in a more efficient EPC. The present invention has a small voltage difference between the anode and the cathode, thereby requiring a smaller anode drive voltage than the prior art. The control circuit of the present invention is less complex, thereby improving the overall efficiency of the EPC.

While particular embodiments of the invention have been shown and described, numerous variations and alternate embodiments will occur to those skilled in the art. Accordingly, it is intended that the invention be limited only in terms of the appended claims.

What is claimed is:

1. An anode voltage control circuit for an electronic power conditioner for supplying a plurality of collector voltages and a cathode voltage to at least two traveling wave tubes, said anode voltage control circuit comprising:
- a first anode drive circuit having a reference voltage that is more positive than said cathode voltage;
- a first relay coupled between said first anode drive circuit and an anode of one of said at least two traveling wave tubes;
- a second anode drive circuit having a reference voltage that is more positive than said cathode voltage;
- a second relay coupled between said second anode drive circuit and an anode of another of said at least two traveling wave tubes.

2. The anode control circuit as claimed in claim 1 further comprising:
- a first resistive load coupled to said cathode voltage between said anode of one of said at least two traveling wave tubes and said first relay; and
- a second resistive load coupled to said cathode voltage between said anode of another of said at least two traveling wave tubes and said second relay.

3. The anode control circuit as claimed in claim 2 wherein said first and second resistive loads further comprise a resistor having a resistance of at least 100 megaohms.

4. The anode control circuit as claimed in claim 1 wherein said first and second reference voltages are referenced to one of said plurality of collector voltages.

5. The anode control circuit as claimed in claim 1 wherein each of said at least two traveling wave tubes is operated by opening and closing said first and second relays, thereby providing a path between said cathode voltage and said anode of said at least two traveling wave tubes.

6. A method for operating at least two traveling wave tubes that are powered by a common electronic power conditioner supplying a cathode voltage and a plurality of collector voltages to said at least two traveling wave tubes, said method comprising the steps of:
- referencing a first anode drive circuit to a reference voltage that is higher than said cathode voltage;
- referencing a second anode drive circuit to a reference voltage that is higher than said cathode voltage;
- operating at least one traveling wave tube by opening a relay disposed between said anode drive circuit and an anode of said at least one traveling wave tube to be operated thereby creating a path between said cathode and said anode of said at least one traveling wave tube to be operated;
- whereby said anode voltage is made to be equal with said cathode potential thereby turning said at least one traveling wave tube off.

* * * * *